(12) United States Patent
Gupta

(10) Patent No.: US 8,797,794 B2
(45) Date of Patent: Aug. 5, 2014

(54) THYRISTOR MEMORY AND METHODS OF OPERATION

(75) Inventor: Rajesh N. Gupta, Alviso, CA (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 13/535,048

(22) Filed: Jun. 27, 2012

(65) Prior Publication Data

US 2014/0003140 A1 Jan. 2, 2014

(51) Int. Cl.
*G11C 11/34* (2006.01)
*G11C 11/39* (2006.01)
*B82Y 10/00* (2011.01)

(52) U.S. Cl.
CPC ................ *G11C 11/39* (2013.01); *B82Y 10/00* (2013.01)
USPC .......................... 365/180; 365/175

(58) Field of Classification Search
CPC ........ G11C 11/36; G11C 11/39; B82Y 10/00; H01L 27/1021; H03K 3/352
USPC ................................. 365/175, 180
See application file for complete search history.

(56) References Cited

U.S. PATENT DOCUMENTS

| | | | |
|---|---|---|---|
| 6,462,359 B1 * | 10/2002 | Nemati et al. ............... | 257/107 |
| 6,627,924 B2 | 9/2003 | Hsu et al. | |
| 6,735,113 B2 | 5/2004 | Yoon et al. | |
| 7,460,395 B1 * | 12/2008 | Cho et al. ................... | 365/180 |
| 7,755,937 B2 | 7/2010 | Kitagawa | |
| 7,940,560 B2 | 5/2011 | Cho | |
| 7,969,777 B1 | 6/2011 | Cho et al. | |
| 2008/0242009 A1 * | 10/2008 | Cho .............................. | 438/135 |
| 2009/0162979 A1 * | 6/2009 | Yang et al. ................... | 438/136 |
| 2009/0213648 A1 * | 8/2009 | Slesazeck ..................... | 365/180 |

OTHER PUBLICATIONS

Cho, Hyun-Jin, et al., "A novel capacitor-less DRAM cell using Thin Capacitively-Coupled Thyristor (TCCT)", IEDM Technical Digest, IEEE, (2005), 311-314.

Ershov, M., et al., "Optimization of Substrate Doping for Back-Gate Control in SOI T-RAM Memory Technology", SOI Conference, 2005. Proceedings. 2005 IEEE International, (2005), 215-216.

Nemati, et al., "Fully Planar 0.562µm2 T-RAM Cell in a 130nm SOI SMOS Logic Technology for High-Density High-Performance SRAMs", Proc. of IEDM, (2004).

Nemati, F, et al., "A novel thyristor-based SRAM cell (T-RAM) for high-speed, low-voltage, giga-scale memories", International Electron Devices Meeting 1999. Technical Digest, (1999), 283-286.

(Continued)

*Primary Examiner* — Hoai V Ho
(74) *Attorney, Agent, or Firm* — Schwegman, Lundberg & Woessner, P.A.

(57) ABSTRACT

Apparatuses and methods can include write schemes for a thyristor memory cell in which an access pulse applied to the gate of the thyristor memory cell is adjusted relative to the data pulse to write data into the thyristor memory cell. Some of the write schemes may substantially reduce or eliminate an unselected data line disturb. In various embodiments, the thyristor memory cell can be structured with two control nodes and its cathode or anode coupled to a reference voltage node common to all thyristor memory cells in a memory array. Additional apparatuses and methods are disclosed.

13 Claims, 9 Drawing Sheets

(56) References Cited

OTHER PUBLICATIONS

Roy, Rich, et al., "Thyristor-Based Volatile Memory in Nano-Scale CMOS", ISSCCm, Session 34, SRAM, 34.6, [Online]. Retrieved from the Internet: <URL: http://www.tram.com/technology/documents/ISSCC2006_TRAM.pdf>, (2006), 3 pgs.

Salling, Craig, et al., "Reliability of Thyristor-based Memory Cells", [Online]. Retrieved from the Internet: <URL: http://www.t-ram.com/news/media/3B.1_IRPS2009_Salling.pdf>, (Accessed Jun. 28, 2012), 7 pgs.

Yang, K J, et al., "Optimization of Nanoscale Thyristors on SOI for High-Performance High-Density Memories", International SOI Conference, 2006 IEEE, (2006), 113-114.

\* cited by examiner

US 8,797,794 B2

THYRISTOR MEMORY AND METHODS OF OPERATION

BACKGROUND

The semiconductor device industry has a market driven need to improve operation of electronic devices. Improvements to electronic devices can be addressed by advances in the design of structures that are used to facilitate the proper functioning of the electronic devices.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
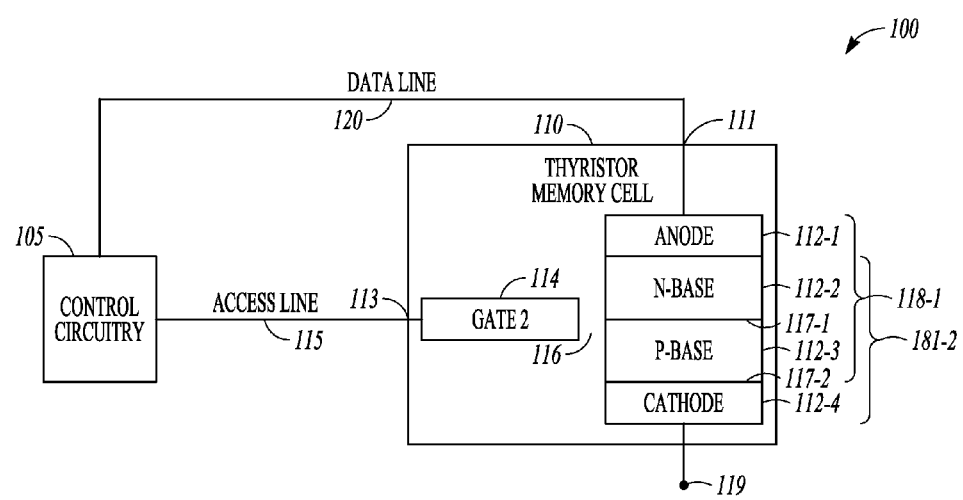
FIG. 1 shows a block diagram of an example apparatus including a thyristor memory cell having two control nodes, in accordance with various embodiments.

FIG. 1 shows a block diagram of an example embodiment of an apparatus 100 including a thyristor memory cell 110 having just two control nodes 111 and 113. Apparatus 100 includes control circuitry 105 to apply signals to two control nodes 111 and 113. Control circuitry 105 can apply a signal to control node 111 via a data line 120. Data line 120 may be arranged to also receive a signal from control node 111. Control node 113 can couple control circuitry 105 to a gate 114 of thyristor memory cell 110 via access line 115. A thyristor memory cell, such as a thyristor random access memory cell, is often referred to herein as a TRAM cell.

Control circuitry 105 can be integrated on an integrated circuit chip with a memory array containing a plurality of TRAM cells. Control circuitry 105 can be arranged on a different integrated circuit chip from a memory array containing a plurality of TRAM cells. Control circuitry 105 can apply signals to two control nodes 111 and 113 as pulses. A pulse is a waveform having a fluctuation of a quantity, such as an electrical quantity including but not limited to a voltage or current, about a reference, where the pulse can be characterized as having a leading edge (also referred to as a rising edge), a pulse height, and a trailing edge (also referred to as a falling edge). In a positive pulse, the leading edge rises to the pulse height and then the trailing edge falls back to the reference level. In a negative pulse, the leading edge changes from the reference level to the pulse height in the negative direction and then the trailing edge returns back to the reference level. Control circuitry 105 can include data registers and timing circuits to apply the pulses with selected waveforms. The selected waveforms can include, but is not limited to, selected signal amplitudes of its pulse height, pulse times (intervals at which the pulse has been changed from its reference level), time intervals at which the pulse is held to a level different from its reference level.

TRAM cell 110 includes four semiconductor regions 112-1, 112-2, 112-3, and 112-4, where each region is of a different conductivity type from the adjoining region that it contacts. Region 112-1 can be structured as an anode coupled to control node 111. Region 112-4 can be structured as a cathode. Region 112-3 is structured as a base separated from gate 114 by a dielectric 116. Gate 114 can be coupled to control node 113. Region 112-4 structured as a cathode can be fixed to a node 119 that is not structured in apparatus 100 to receive a control signal. Node 119 can be structured as a reference voltage node common to all TRAM cells in a memory array. Node 119 can be arranged to couple to ground or to a fixed reference voltage such as zero volts. The fixed reference voltage may be set to a fixed non-zero voltage. Polarity of the voltage at node 119 can be set such that, in operation, TRAM 110 has a higher voltage at the anode than at the cathode.

In an example embodiment, TRAM cell 110 can be structured with region 112-1 formed as a p+-type semiconductor region, region 112-2 formed as a n-type semiconductor region, region 112-3 formed as a p-type semiconductor region, and region 112-4 formed as a n+-type semiconductor region. P+-type semiconductor region 112-1, n-type semiconductor region 112-2, and p-type semiconductor region 112-3 form a pnp bipolar transistor 118-1. N-type semiconductor region 112-2, p-type semiconductor region 112-3, and n+-type semiconductor region 112-4 form an npn bipolar transistor 118-2 having p-type semiconductor region 112-3 as a base, which can be referred to as a pbase. Gate 114 is capacitively coupled to pbase 112-3 by dielectric 116.

Alternatively, TRAM cell 110 can be structured with region 112-1 formed as a n+-type semiconductor region, region 112-2 formed as a p-type semiconductor region, region 112-3 formed as a n-type semiconductor region, and region 112-4 formed as a p+-type semiconductor region. In such a configuration, region 112-1 is a cathode and region 112-4 is an anode. In this case, n+-type semiconductor region 112-1, p-type semiconductor region 112-2, and n-type semiconductor region 112-3 form bipolar transistor 118-1 as a npn transistor 118-1. Also in this case, p-type semiconductor region 112-2, n-type semiconductor region 112-3, and p+-type semiconductor region 112-4 form bipolar transistor 118-2 as a pnp transistor 118-2 having n-type semiconductor region 112-3 as a base, which can be referred to as a nbase. Gate 114 is capacitively coupled to nbase 112-3 by dielectric 116. The conductivity of the base regions may be either due to doping or by electrostatic coupling from a control node (e.g., an electrode).

Consider the architecture with TRAM cell 110, configured as a thin capacitively coupled thyristor (TCCT), having a p+ anode and n+ cathode. The voltage of pbase 112-3 determines the thyristor state. Even though the TRAM cell does not conduct current during standby depending on its behavior if a read were to be performed, the cell is said to be in a high current or low current state. The floating voltage of pbase 112-3 can be placed in a high voltage (or high current) state or low (including negative) voltage state. If the pbase is in the high voltage state, reading the cell will turn-on the thyristor and the TRAM cell will conduct current. On the other hand if the pbase is in the low voltage state, reading the TRAM cell will not turn on the cell and the TRAM cell will conduct much lower current, typically 4-6 orders of magnitude lower than the conducting state. Depending on the overall arrangement of apparatus 100, the high current state can be set as a high state for data and the low current state can be set to a low state for data. The capacitance provided by the gate 114 to pbase 112-3 structure holds the pbase voltage and hence the data state of the device. Junctions 117-1 and 117-2 to pbase 112-3 may provide charge leakages such that periodic refresh (e.g., restore) may be conducted to maintain the data state.

TRAM cell 110 can be read with a positive voltage across TRAM cell 110, provided by a high voltage at anode 112-1 from the data line at control node 111 and zero volts at cathode 112-4. If pbase 112-3 is in a high state, junction 117-2 is forward biased, which turns on npn transistor 118-2 and latches the TCCT to the conducting state. If pbase 112-3 is in a low state, junction 117-2 has a small forward biased or is reversed biased such that npn transistor 118-2 does not turn on. With npn transistor 118-2 off, the TCCT does not latch and the TCCT is in the blocking state.

Figure 2:
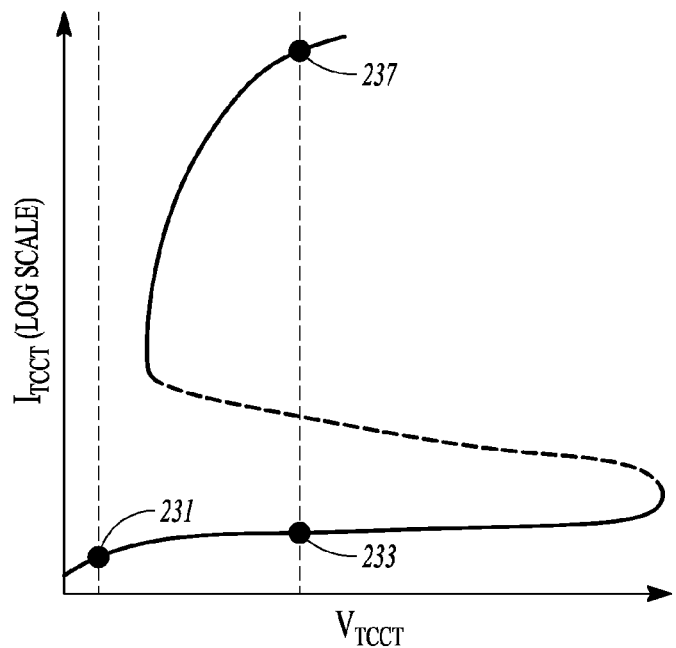
FIG. 2 shows a graph of current through a thyristor memory cell as a function of voltage across the thyristor memory cell between the anode and cathode of the thyristor memory, in accordance with various embodiments.

FIG. 2 shows a graph of current, $I_{TCCT}$, through a thyristor memory cell as a function of voltage, $V_{TCCT}$, across the thyristor memory cell, such as TRAM cell 100, between the anode and cathode of the thyristor memory. At a sufficiently low $V_{TCCT}$, the device is in a standby state 231 for both a data zero (D0) state and a data one (D1) state, which is at a higher p-base voltage than a data zero (D0) state.

To write to TRAM cell 110, the voltage of pbase 112-3 can be capacitively raised with the rising edge of a pulse applied at gate 114 from access line 113. For a D1 state with the voltage across the TCCT greater than or equal to about 1V, both npn transistor 118-2 and pnp transistor 118-1 are on and the TCCT latches. For the D0 state, with the voltage across the TCCT less than or equal to about 0.5 V, the current across the TCCT is low and the TCCT does not latch.

In the write process, pbase 112-3 can be capacitively programmed by the falling edge of the applied access pulse at gate 114 from the access line 113. For the D1 state, since the TCCT is latched the pnp transistor 118-1 actively supplies holes to pbase 112-3 and holds the high voltage of pbase 112-3. For the D0 state, the pulse at gate 114 capacitively couples pbase 112-3 negative, since the TCCT is not latched and hence the pnp transistor 118-1 is off and the voltage of pbase 112-3 is programmed low.

In both the read and write operations on TRAM cell 110, cathode 112-4 can be set to a fixed voltage such as zero volts. With each TRAM cell 110 in a memory array having a cathode set to a fixed voltage, the memory array can be structured with cathode 112-4 of TRAM cell 110 having a common cathode. A TRAM common cathode in a memory array allows for denser $4F^2$ integration of the memory cell. For $4F^2$ integration, a memory cell has a surface area that is approximately $4F^2$, where F is a minimum feature size of the memory cell. However, with a memory device structures with TRAM cells having common cathodes, a possible fail mode may be introduced with the operation of a TRAM cell in the memory array of the memory device. This fail mode relates to an unselected cell, having recently been programmed to a high state, being turned-on by reading another cell sharing the same data line and common cathode, even though the access line to the unselected cell is not activated by a select signal.

Figure 3:
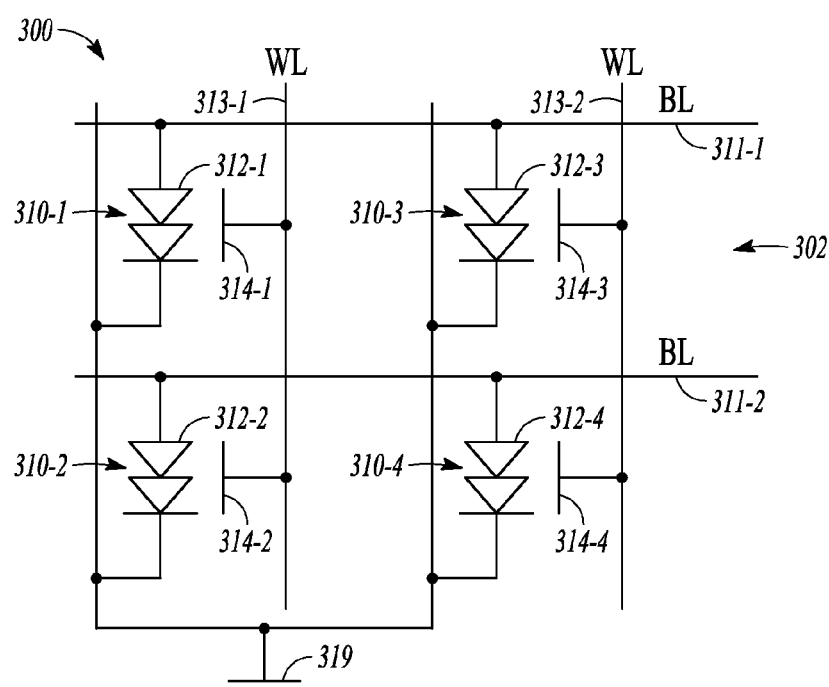
FIG. 3 shows an example of a group of memory cells in a memory array of a memory device, in accordance with various embodiments.

FIG. 3 shows an embodiment of an example group of memory cells in a memory array 302 of a memory device 300. The example group of memory cells is structured as TRAM cells 310-1, 310-2, 310-3, and 310-4 sharing a common cathode 319. The number of memory cells in the memory array depends on the memory device formed. Each of TRAM cells 310-1, 310-2, 310-3, and 310-4 has two control nodes. One control node of each of TRAM cells 310-1 and 310-3 couples anodes 312-1 and 312-3 of the respective TRAM cells to a data line (BL) 311-1, which operates as a common data line to these two memory cells. The number of memory cells sharing a common line 311-1 can be considerably larger than two. Though TRAM cells 310-1 and 310-3 share common data line 311-1, TRAM cells 310-1 and 310-3 can be individually selected at their other control node by access lines 313-1 and 313-2, respectively, coupled to their respective gates 314-1 and 314-3. One control node of each of TRAM cells 310-2 and 310-4 couples anodes 312-2 and 312-4 of the respective TRAM cells to a data line (BL) 311-2, which operates as a common data line to these two memory cells. The number of memory cells sharing a common line 311-2 can be considerably larger than two. Though TRAM cells 310-2 and 310-4 share common data line 311-2, TRAM cells 310-2 and 310-4 can be individually selected at their other control node by access lines 313-1 and 313-2, respectively, coupled to their respective gates 314-2 and 314-4. In the array structure, access line 313-1 is coupled to both TRAM cells 310-1 and 310-2 and access line 313-2 is coupled to both TRAM cells 310-3 and 310-4. It is noted with the conductivity types reversed in the TRAM cells, the cathodes of the TRAM cells can coupled to data lines and their respective anodes can be coupled to a common anode with signals appropriately adjusted.

Figure 4A:
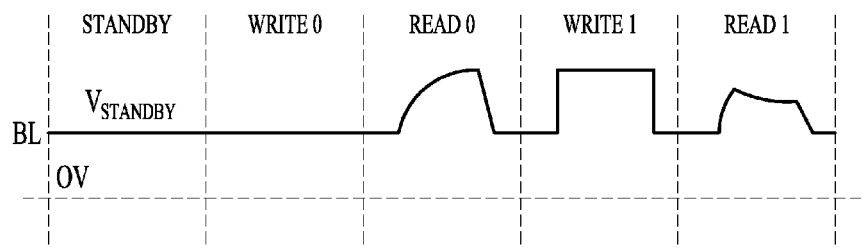
FIG. 4A-C show voltages on a data line and an access line coupled to a thyristor memory cell of a memory device with a common cathode at a fixed voltage, in accordance with various embodiments.
Figure 4B:
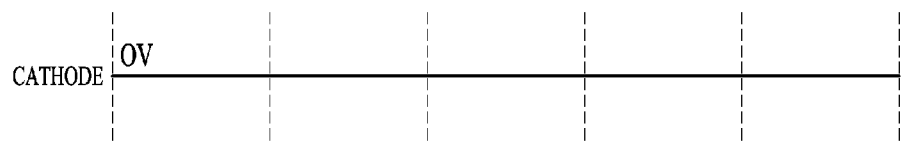
Figure 4C:
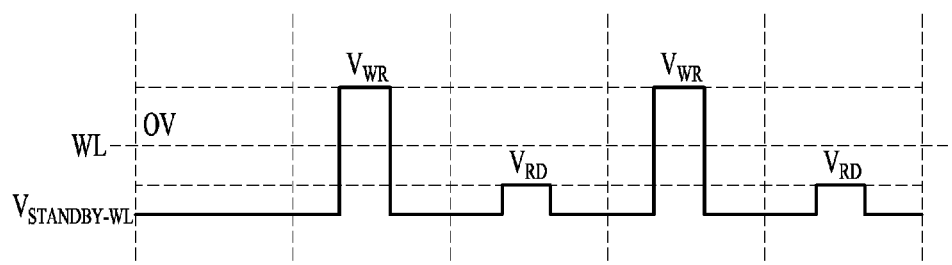

FIG. 4A-C show voltages on a data line and an access line coupled to a thyristor memory cell of a memory device 300 with a common cathode at a fixed voltage. Voltages can be applied to data lines to set TRAM cells to standby states. The selection can be set based on the physical characteristics of the TRAM cells. The standby level, $V_{STANDBY-BL}$, of the data lines can be set to about a voltage equal to a level of the write voltage of the data D0 state. For example, $V_{STANDBY-BL}$ can be set to about 0.4 V. Other voltages can be used for $V_{STANDBY-BL}$. Access lines can be set to standby levels when TRAM cells coupled to the access lines are not being accessed to write or read. The standby level, $V_{STANDBY-WL}$, of the access lines can be set to a voltage below zero volts. For example, $V_{STANDBY-WL}$ can be set to voltages such as −0.8V or −2V. $V_{STANDBY-WL}$ can be limited by the reliability of the dielectric between the gate and the base adjacent the cathode, for example, dielectric 116 between gate 114 and base 112-3 of TRAM 110 of FIG. 1. For writing and reading, a pulse is applied to an access line that selects a TRAM from among TRAM cells coupled to the same data line, where the pulse changes the voltage on the access line from the standby level. The pulse for writing can rise to a high level $V_{WR}$ such as a supply voltage $V_{DD}$ for writing the D1 state. The pulse for reading can rise to a lower level $V_{RD}$.

Consider TRAM 310-1 of memory array 302 with respect FIG. 4A. Data line 311-1 can be set to the standby level $V_{STANDBY-BL}$, for example to 0.4V, for writing the D0 state and pulled to a high level such as a supply voltage $V_{DD}$ for writing the D1 state, for example to 1.4V. For a read operation, data line 311-1 is pulled towards 1.4V. If TRAM 310-1 turns on, data line 311-1 is pulled lower than 1.4V for the D1 state. Data line 311-1 charges to 1.4V for the D0 state, when TRAM 310-1 does not turn on.

A TRAM cell to which a D1 state is written can interfere with the read of another cell, where the TRAM cell being read (victim) shares the same data line and a common cathode, but a different access line, as the recently written TRAM cell (Aggressor). Since the aggressor TRAM cell, was written to the D1 state recently, it has remaining minority carriers. When the anode voltage rises to 1.4V with the common cathode fixed at 0V, the voltage across the TRAM cell, $V_{TCCT}$, is high and the recently written to TRAM cell may turn-on even in the absence of a select signal (WL pulsing to $V_{RD}$). The select signal to a TRAM capacitively couples the Pbase to a higher voltage. This assists a TRAM cell in a D1 state (high Pbase voltage) to turn on even if the pbase voltage is not high enough to turn-on on its own. This assist can be referred to as a WL assist. For a TRAM cell in the D0 state (low or negative Pbase voltage) this WL assist is not enough to turn on the cell. To resolve the possible occurrence of a read disturb at a TRAM cell, the TRAM cell may be designed such that it cannot turn-on in the absence of a WL assist (TRAM select). It is noted that the occurrence of the disturb mechanism may be avoided when the write to a TRAM cell and a read of another TRAM cell is separated in time by a sufficient interval.

For a TRAM cell, such as TRAM cell 110 of FIG. 1, having two control nodes and a cathode fixed to a voltage such as zero volts, a write operation can be conducted by applying a voltage to the TRAM's anode with respect to its cathode with a pulse applied to the gate of the TRAM cell. The rising edge of the pulse raises the voltage level of the pbase of the TRAM. In writing a high D1 state, at the falling edge of the pulse to the gate of the TRAM, the pnp supplies holes to the pbase of the TRAM such that the voltage of the pbase stays high. For writing a low D0 state, the gate of the TRAM couples the pbase negative such that the pbase is low. The falling edge of the gate pulse capacitively programs the pbase voltage during a write, where the voltage of the pbase at the end of the write can be greater than about 0.6V for a write D1 and about −1V for write D0. After the write operation the Pbase voltage will gradually drift towards its equilibrium value close to 0V.

Figure 5A:
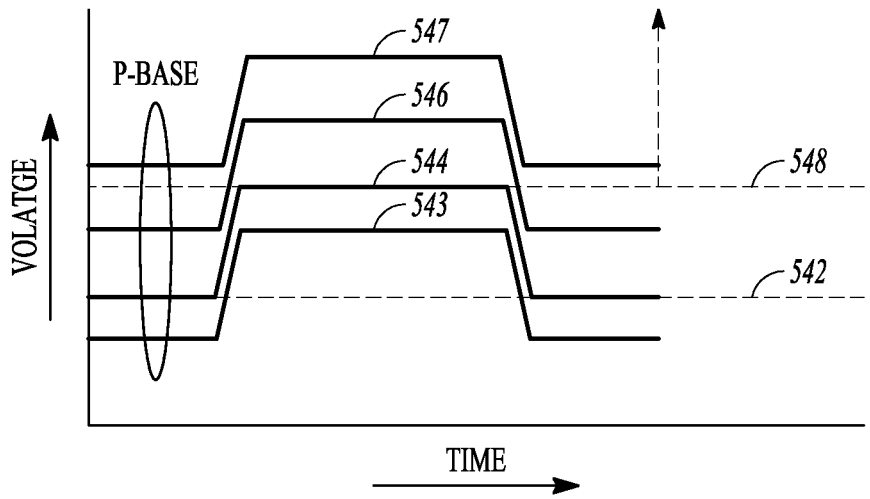
FIG. 5A shows various starting pbase voltages for a read waveform on an access line coupled to the gate of a thyristor memory cell shown in FIG. 5B, in accordance with various embodiments.
Figure 5B:
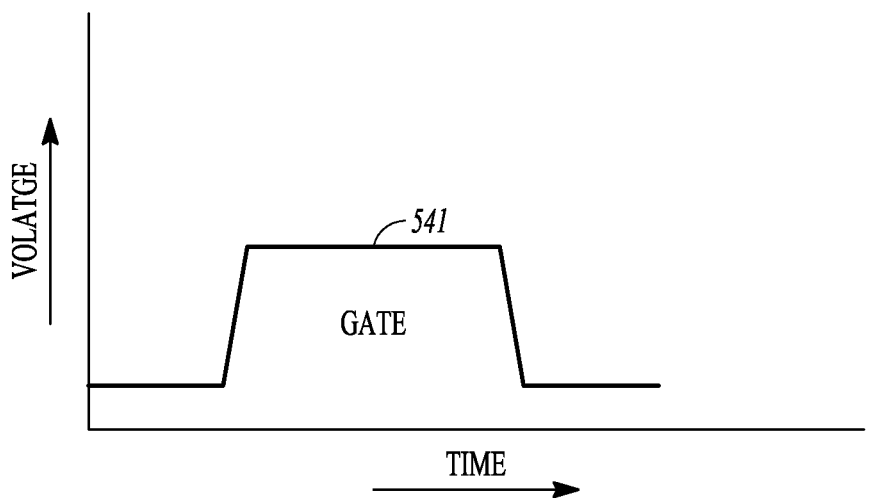

FIG. 5A shows various starting pbase voltages for a read waveform (WL pulse) 541 on an access line coupled to the gate of a TRAM cell shown in FIG. 5B. The effect of the WL pulse is to capacitively couple up the pbase voltage during the read. Level 548 shows a level at which the TRAM latches, during a read, if the voltage of its pbase is above this level. Level 542 shows an effective pre-read latch level. Due to the WL assist effect from applying a pulse to the gate of the TRAM cell, the level 542 is lower than level 548. Equivalently, the WL read pulse reduces the effective pbase latching threshold to level 542. Before a read, if the voltage of the pbase is below level 542, a D0 state will be read. Otherwise, if the voltage of the pbase is above level 542, a D1 state will be read. Curve 543 shows the pbase having a voltage lower than latching threshold even after the assist of the WL pulse. A D0 state is read from the TRAM cell in this case. Curve 544 shows the pbase having a voltage exactly at the latching threshold after the WL assist. A D1 state is read, but marginally, from the TRAM cell in this case. Curve 546 shows the pbase having a voltage higher than the latching threshold after the WL assist. A D1 state is read consistently from the TRAM cell in this case. Curve 547 shows the pbase having a voltage higher than the latching threshold after the WL assist. A D1 state is read consistently from the TRAM cell in this case. Further, even in the absence of WL pulse (absence of the WL assist) a D1 state will read from the TRAM cell in this case. This case is vulnerable to a read disturb. With sufficient time, the voltage of the pbase for state D1 at the level at which a D1 state is read without a WL assist will lower to the level at which a D1 state is read with a WL assist. It is noted that the time for which the voltage of the pbase for a D1 state reduces below level 542 or where the voltage of the pbase for a D0 state rises above 542 is the data retention time.

Figure 6:
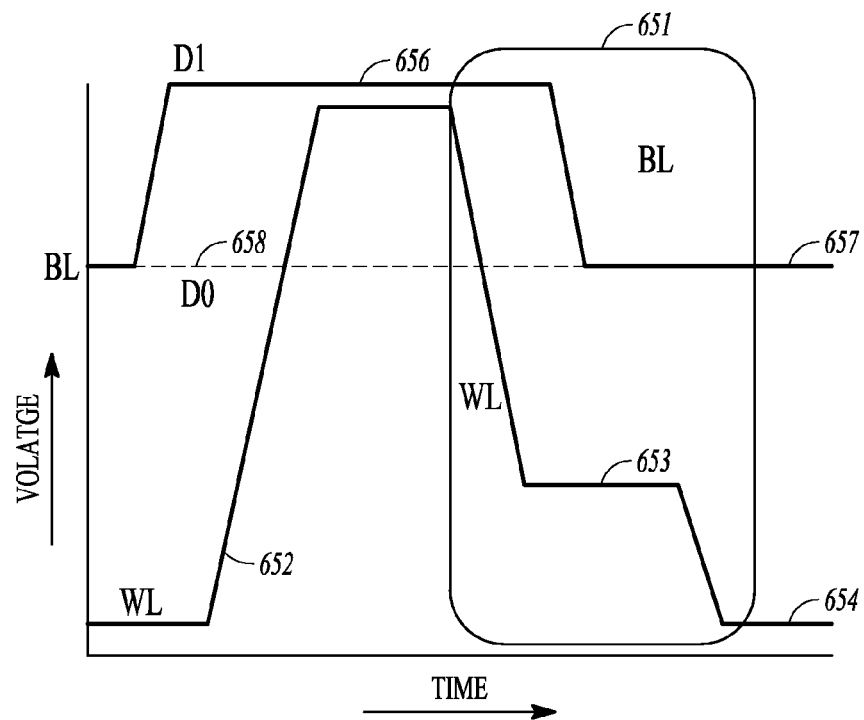
FIG. 6 illustrates features of writing data into a thyristor memory cell of a memory array, in accordance with various embodiments.

FIG. 6 illustrates features of an embodiment of writing data into a TRAM memory cell of a memory array. The TRAM memory cells of the memory array can be structured such that cathodes of the TRAM memory cells are structured as common cathodes that can be operated at a fixed voltage. The TRAM memory cell of a memory array can be arranged in a similar, an identical, or an equivalent manner as in FIG. 3. Region 651 shows the trailing edge of an access pulse applied to the gate of the TRAM memory cell relative to the trailing edge of the data pulse applied to the anode of the TRAM memory cell in writing into the TRAM memory cell. The access pulse, shown here as WL pulse 652, applied to the gate of the TRAM cell undergoes a change during the trailing edge of WL pulse 652. This change includes the voltage of WL pulse 652 on the access line moving (e.g., falling) to an intermediate voltage. WL pulse 652 is structured such that data pulse 656 (BL pulse 656) for writing a D1 state on the data line comes to a voltage of standby level 657 of the data line, referred to as the data line standby voltage, before WL pulse 652 returns to standby level 654 of the access line, referred to as the access standby voltage. The data line for writing a D0 state can be set at a level 658, which may be the same as standby level 657. As shown, WL pulse 652 can be structured such that the voltage of WL pulse 652 is maintained at intermediate level 653 until at least data pulse 656 on the data line comes to a voltage of the standby level 657 of the data line. Intermediate level 653 may be a range of voltages. The voltage of intermediate level 653 may be constant or may vary over a selected range. Alternatively, the voltage of WL pulse 652 can be returned to standby level 654 of the access line as data pulse 656 on the data line comes to standby level 657 of the data line.

The write scheme illustrated in region 651 can be viewed as being equivalent to a write followed by a weak D0 write. A write D1 state can be viewed as a write D1 plus a weak write D0. A write D0 can be viewed as a write D0 plus a weak write D0. The write of a D0 state is not affected by the access pulse 652, which is different from a conventional access pulse. Access pulse 652 for writing a D1 state provides a change to programming the pbase of the TRAM. The write D1 operation is altered to program the pbase to a voltage based on the intermediate level 653 of the WL pulse before the data pulse 656 returns to standby level 657. This pbase programming allows the pbase to be programmed below the level where the TRAM cell latches without assist of the WL pulse. This programming may reduce or eliminate occurrence of an unselected read disturb.

Figure 7:
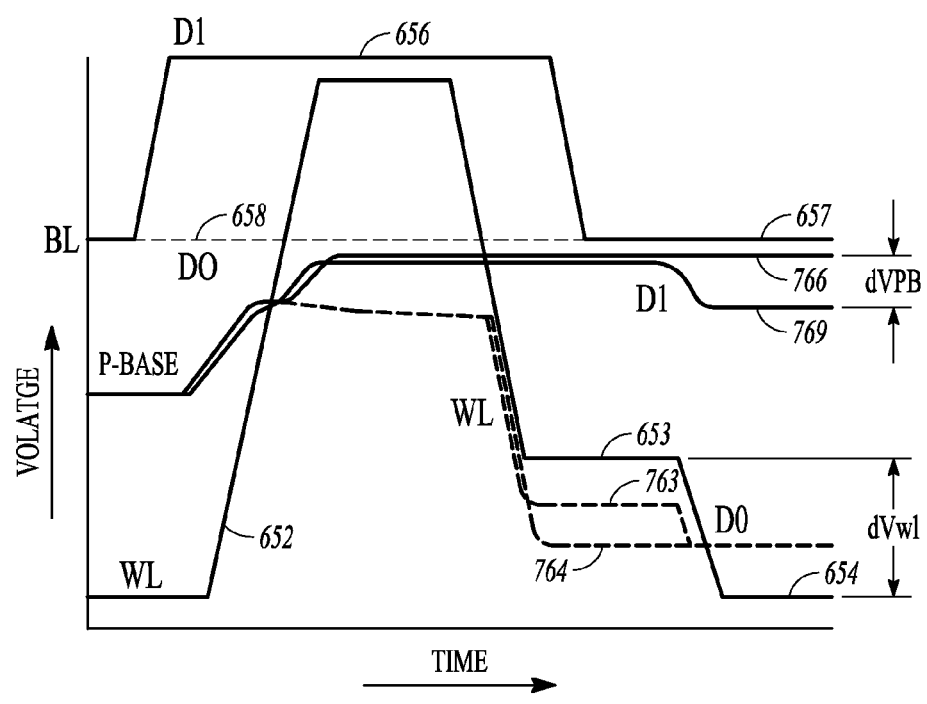
FIG. 7 illustrates the voltage of the pbase of a thyristor memory cell associated with writing data into the thyristor memory cell as conducted with respect to FIG. 6, in accordance with various embodiments.

FIG. 7 illustrates voltage of the pbase of a TRAM cell associated with writing data into the TRAM as conducted with respect to FIG. 6. Curve 763 illustrates the pbase voltage for writing a D0 state using WL pulse 652. Curve 764 illustrates the pbase voltage for writing a D0 state using a conventional access pulse that does not include an intermediate level in the falling edge of the access pulse. Curve 766 illustrates the pbase voltage for writing a D1 state using a conventional access pulse that does not include an intermediate level in the falling edge of the access pulse. Curve 769 illustrates the pbase voltage for writing a D1 state using WL pulse 652. Using WL pulse 652 writes pbase to a lower voltage than attained by a conventional access pulse. This voltage difference is a function of the intermediate WL voltage at level 653. This voltage difference, dVpb, is equal to dVwl* (gate_to_pbase_capacitive_coupling), where dVwl is the difference between the intermediate WL voltage of level 653 and the access standby voltage of level 654. Voltage difference, dVpb, can be varied or set to any arbitrary value by selecting the intermediate WL voltage.

Figure 8:
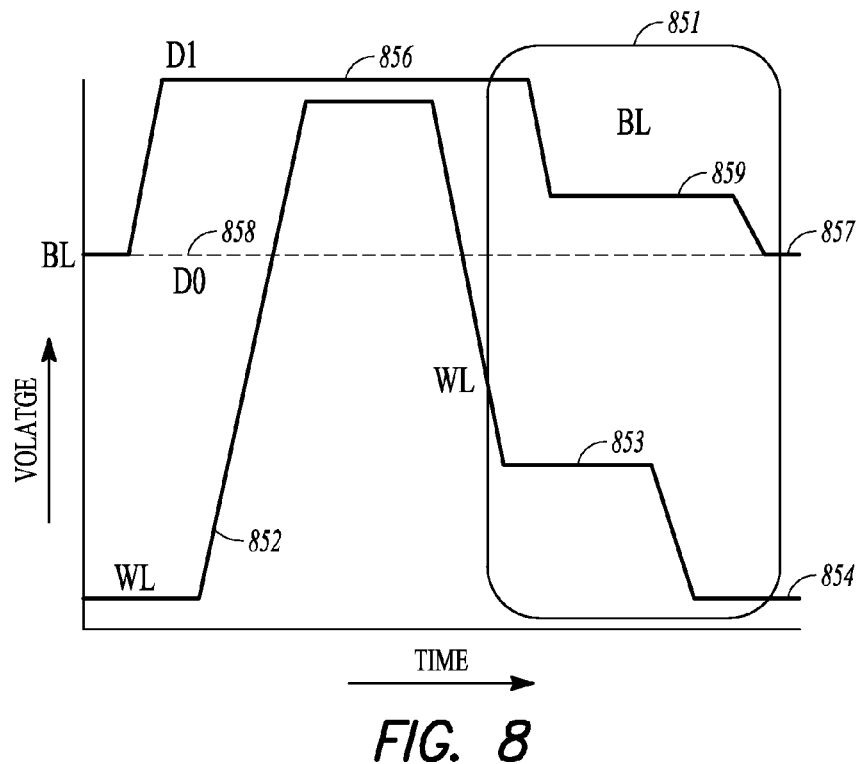
FIG. 8 shows features of writing data into a thyristor memory cell of a memory array, in accordance with various embodiments.

FIG. 8 shows features of an embodiment of writing data into a TRAM memory cell of a memory array. The TRAM memory cells of the memory array can be structured such that cathodes of the TRAM memory cells are structured as common cathodes that can be operated at a fixed voltage. The TRAM memory cell of a memory array can be arranged in a similar, an identical, or an equivalent manner as in FIG. 3. Region 851 shows the trailing edge of an access pulse applied to the gate of the TRAM memory cell relative to the trailing edge of the data pulse applied to the anode of the TRAM memory cell in writing into the TRAM memory cell. The access pulse, shown here as WL pulse 852, applied to the access line coupled to the gate of the TRAM cell undergoes a change during the trailing edge of WL pulse 852 along with data pulse 856 (BL pulse 856) for writing a D1 state undergoing a change during the trailing edge of data pulse 856. These changes include the voltage of WL pulse 852 on the access line moving to a voltage of an access intermediate level 853 and the voltage of the data pulse 856 moving to a voltage of a data line intermediate level 859. WL pulse 852 and data pulse 856 can be structured such that the voltage of WL pulse 852 comes to access intermediate level 853 before the voltage of data pulse 856 comes to data line intermediate level 859. WL pulse 852 and data pulse 856 can be structured such that the voltage of WL pulse 852 comes to access intermediate level 853 before the voltage of data pulse 856 begins falling in the trailing edge of data pulse 856. WL pulse 852 and data pulse 856 can be structured such that the voltage of WL pulse 852 comes to access intermediate level 853 then the voltage of data pulse 856 comes to data line intermediate level 859. The data line for writing a D0 state can be set at a level 858, which may be the same as standby level 857. As shown, WL pulse 852 can be structured such that the voltage of WL pulse 852 returns from access intermediate level 853 to standby level 854 of the access line before data pulse 856 returns from data line intermediate level 859 to data line standby level 859. Data line intermediate level 859 may be a range of voltages including equal to level 857, which may be the same as the standby level. The voltage of data line intermediate level 859 may be constant or may vary over a selected range. Access intermediate level 853 may be a range of voltages. The voltage of access intermediate level 853 may be constant or may vary over a selected range.

Data pulse 856 can be structured to include moving the voltage of data pulse 856 to data line intermediate level 859 such that the voltage across the TRAM cell is small. The range of the small voltage can be correlated to those voltages that, if applied in a traditional write operation, would correspond to a write D0 operation. For an example 45 nm cell, the voltage on the data line can be up to about 1V to perform a D0 state write, where the data line standby level may be about 0.4 V. So, with the cathode being held at GND=0V, the data line can be up to about 1 V at data line intermediate level 859.

Various combinations with different data line intermediate voltages can be used, so long as the anode to cathode voltage is low enough such that the current flowing through the cell is small. Such a small current corresponds to a current smaller than the capacitive displacement current flowing through the gate of the TRAM cell. Such a voltage on the data line for writing a data state D1 can be viewed as being equivalent to a data line standby voltage or a level for writing a data state 0 on the data line. For example, writing a D1 state, the voltage of the data line can be set above the write D0 level and then set to be lower than the write D0 level. For writing a D0 state, the voltage on the data line is below the level for writing the D0 state during the entire access pulse ramp down.

Figure 9:
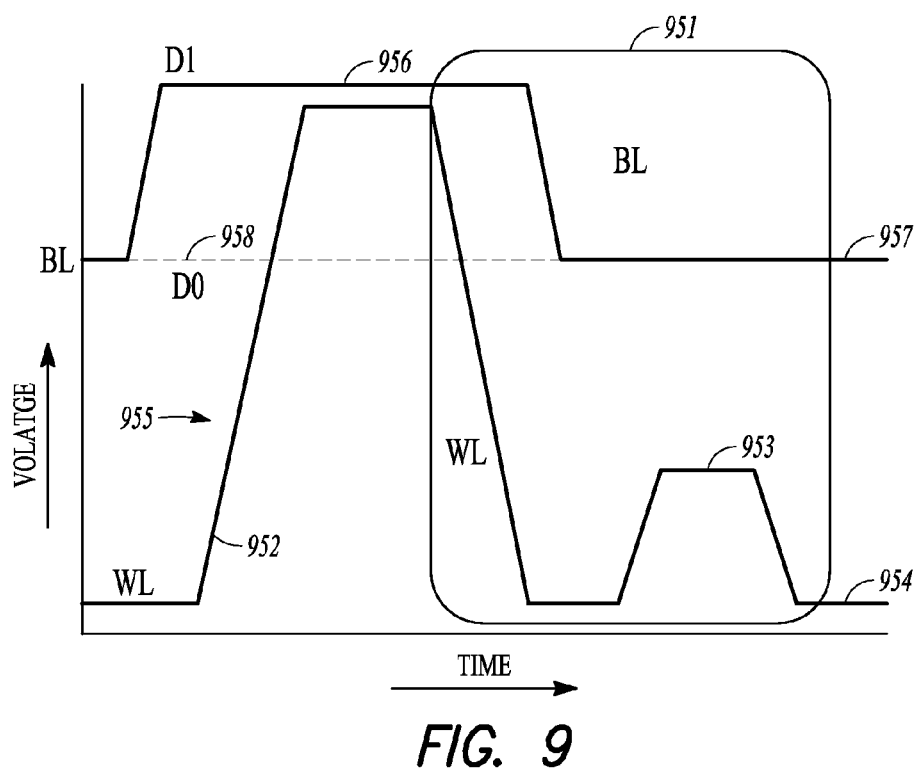
FIG. 9 shows features of writing data into a thyristor memory cell of a memory array, in accordance with various embodiments.

FIG. 9 shows of an embodiment of features of writing data into a TRAM memory cell of a memory array. The TRAM memory cells of the memory array can be structured such that cathodes of the TRAM memory cells are structured as common cathodes that can be operated at a fixed voltage. The TRAM memory cell of a memory array can be arranged in a similar, an identical, or an equivalent manner as in FIG. 3. Region 951 shows the trailing edge of an access pulse applied to the gate of the TRAM memory cell relative to the trailing edge of the data pulse applied to the anode of the TRAM memory cell in writing into the TRAM memory cell. The access pulse, shown here as WL pulse 955, applied to the gate of the TRAM cell includes a pulse 952 followed by a pulse 953, which are applied in relation to data pulse 956 (BL pulse 956) for writing a D1 state. Pulse 952 can be larger than pulse 953. For example, a pulse height of pulse 952 can be higher than a pulse height of pulse 953. Pulse 952 can be structured to return to a level below the pulse height (e.g., maximum voltage) of the pulse 953, including an access standby level 954 before pulse 953 begins its leading edge. Access pulse 955 can be structured with data pulse 956 such that the voltage of data pulse 956 returns to the voltage of its data line standby level 957 after pulse 952 returns to access standby level 954 and before pulse 953 begins its leading edge. Access pulse 955 can be structured with data pulse 956 such that the voltage of data pulse 956 returns to the voltage of its data line standby level 957 while pulse 952 is at access standby level 954 and before pulse 953 begins its leading edge. The maximum voltage of pulse 953 can be set to intermediate level 653 of pulse 652 shown in FIG. 6.

Access pulse 955 can be realized as a conventional access pulse for writing to a memory cell followed by a short access pulse. The short access pulse after the data pulse returns to a data line standby level 957 works like a weak write of a D0 state. The pulse height of this second access pulse determines the pbase voltage reduction for writing a D1 state. The access pulses in the scheme associated with FIG. 9 can be accomplished with a conventional access pulse being applied to an access line followed by applying a dummy read pulse without applying the data line pulse.

Figure 10:
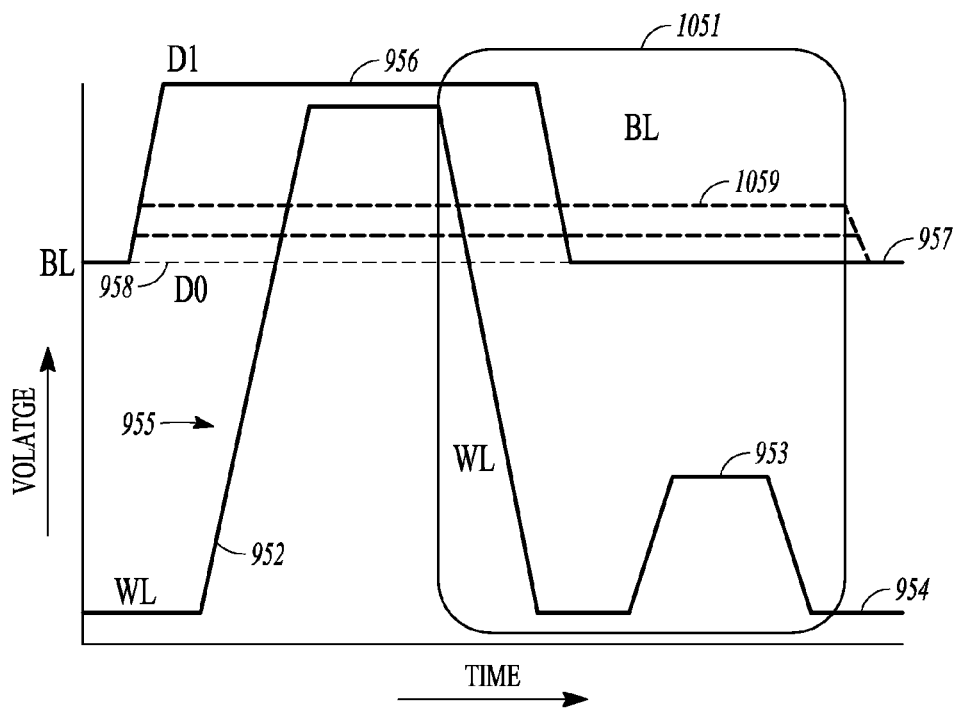
FIG. 10 shows features of writing data into a thyristor memory cell of a memory array as conducted in FIG. 9 with the addition of using a data line intermediate level in the trailing edge of the data pulse, in accordance with various embodiments.

FIG. 10 shows features of an embodiment of writing data into a TRAM memory cell of a memory array as conducted in FIG. 9 with the addition of using a data line intermediate level in the trailing edge of data pulse 956. Region 1051 shows the trailing edge of an access pulse applied to the gate of the TRAM memory cell relative to the trailing edge of the data pulse applied to the anode of the TRAM memory cell in writing into the TRAM memory cell. Access pulse 955 can be structured with data pulse 956 such that the voltage of data pulse 956 is maintained at a data line intermediate level 1059 after pulse 952 returns to access standby level 954 and before pulse 953 begins its leading edge. Access pulse 955 can be structured along with data pulse 956 such that the voltage of data pulse 956 comes to data line intermediate level 1059 as pulse 952 comes to access standby level 954 and before pulse 953 begins its leading edge. Access pulse 955 can be structured along with data pulse 956 such that the voltage of data pulse 956 comes to data line intermediate level 1059 after pulse 952 comes to the access standby level 954 and as pulse 953 begins its leading edge. The maximum voltage of pulse 953 can be set to the intermediate level 653 of pulse 652 shown in FIG. 6.

Access pulse 955 can be realized as a conventional access pulse for writing to a memory cell followed by a short access pulse. The short access pulse after the data pulse returns to a data line standby works like a weak write of a D0 state. The write operation can be views as a regular write pulse a weak write of a D0 state with use of an intermediary voltage to the data line. The pulse height of this second access pulse determines the pbase voltage reduction for writing a D1 state.

Various combinations with different data line intermediate voltages of data line intermediate level 1059 can be used, so long as the anode to cathode voltage is low enough such that the current flowing through the cell is small. Such a small current corresponds to a current smaller than the capacitive displacement current flowing through the gate of the TRAM cell. Such a voltage on the data line for writing a data state D1 can be viewed as being equivalent to a data line standby voltage or a level for writing a data state 0 on the data line. For both writing a D1 state and a D0 state to the TRAM cell, after applying a conventional access pulse, the voltage of the data line can be set below the voltage level to write a D0 state with the short access pulse applied. The pulse height of the second pulse, pulse 953 of access pulse 955, can be smaller than the pulse height of the first pulse, pulse 952 of access pulse 955.

Either of the schemes discussed above with respect to FIGS. 9 and 10 can include a voltage at the height of access pulse 953, following access pulse 952, that is about equal to the voltage for reading from the TRAM cell. Use of this access pulse 953 may eliminate a need for an additional voltage level in the integrated circuit chip, and its associated additional circuit complexity.

Figure 11:
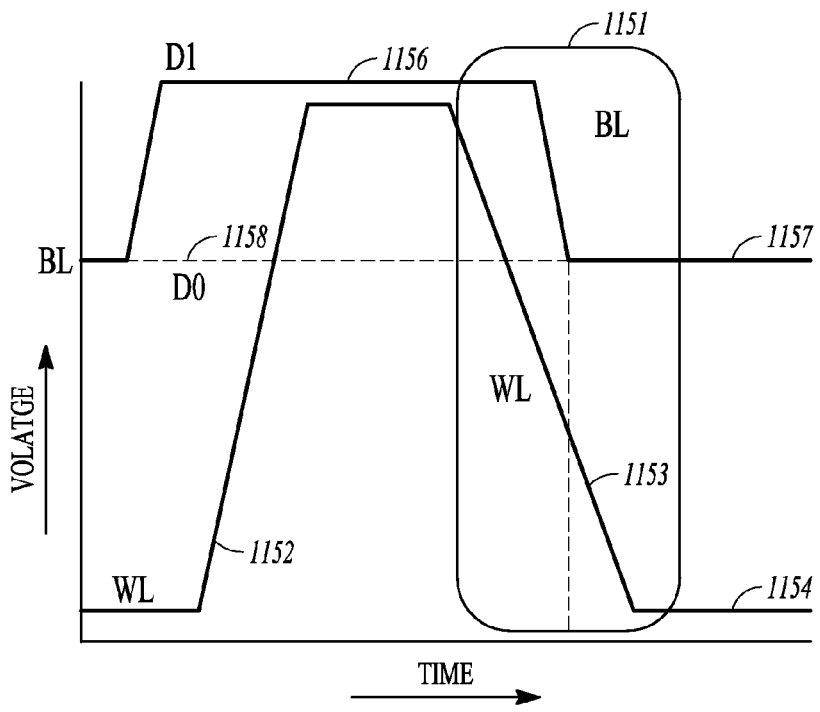
FIG. 11 shows features of writing data into a thyristor memory cell of a memory array, in accordance with various embodiments.

FIG. 11 shows features of an embodiment of writing data into a TRAM memory cell of a memory array. The TRAM memory cells of the memory array can be structured such that cathodes of the TRAM memory cells are structured as common cathodes that can be operated at a fixed voltage. The TRAM memory cell of a memory array can be arranged in a similar, an identical, or an equivalent manner as in FIG. 3. Region 1151 shows the trailing edge of an access pulse applied to the gate of the TRAM memory cell relative to the trailing edge of the data pulse applied to the anode of the TRAM memory cell in writing into the TRAM memory cell. An access pulse, shown here as WL pulse 1152, is structured such that data pulse 1156 (BL pulse 1156) for writing a D1 state on the data line comes to a voltage of standby level 1157 of the data line before WL pulse 1152 returns to standby level 1154 of the access line. The data line for writing a D0 state can be at a level 1158, which may be the same as standby level 1157. This write scheme involves a slow ramp down of WL pulse 1152 such that data pulse 1156 is pulled down to data line standby level 1157 before the voltage of WL pulse is close to the voltage of its standby level 1154. During the short interval when neither the voltage of the data pulse or the access pulse is changing, no significant action is occurring in the TRAM cell. As a result, this period may be substantially reduced or eliminated without any significant effect.

The voltage of WL pulse 1152, at the time when data pulse 1156 returns to data line standby level 1157, is an "effective intermediate" voltage 1153 of data pulse 1156. Effective intermediate voltage 1153 for the write scheme of FIG. 11 can be correlated to access intermediate level 653 of FIG. 6. Effective intermediate voltage 1153 can be set to a voltage approximately equal to a voltage level on the access line of TRAM cell for a read operation. Effective intermediate voltage 1153 can be selected based on the relative timing of the ramps of access pulse 1152 and data pulse 1156 and the ramp down times.

In various embodiments, write schemes for TRAM cells in which the trailing edge of the pulse applied to the gate of the TRAM is adjusted relative to the data pulse to write data into the TRAM cell may reduce or potentially even eliminate unselected data line disturb. These writing schemes allow a selective placement of the voltage of the pbase of the TRAM after conducting a write of the D1 state into the TRAM cell. These write schemes enable $4F^2$ TRAM implementations with two control nodes for each TRAM cell. One of the two control nodes to the TRAM cell can be structured as the coupling of the gate of the TRAM cell with an access line. The other control node to the TRAM cell can be structured as the coupling of the anode of the TRAM cell with a data line WL. These write schemes may also eliminate a need to signal separately the cathode of the TRAM cell to which data is being written. All cathodes can be connected to a common voltage. For example, the common voltage can be set to 0 V or some positive voltage.

For most of the discussions herein, the TRAM cell structure considered has been given for TRAM cell with a pbase adjacent the gate of the TRAM cell. The pbase and the gate can be separated by a dielectric. However, write schemes can be used for a TRAM cell structure in which each region of a particular conductivity type is reversed. For example, the writes schemes can be apply to a TRAM cell with a nbase adjacent the gate of the TRAM cell, where the signal polarities are inverted to accommodate this complementary implementation. Example voltage levels discussed herein have been at levels to be consistent with implementation in silicon. However, TRAM cells can be structured for implementation in other semiconductors. With implementation in other semiconductors, the voltage levels can be translated appropriately.

In various embodiments, a method of writing data to a thyristor memory cell can include applying a data pulse to a data line coupled to a first of the thyristor memory cell, the thyristor memory cell having a second end coupled to a fixed voltage; and applying an access pulse to an access line coupled to a gate of the thyristor memory cell, the access pulse and the data pulse structured such that, after writing to the thyristor memory cell, a base of the thyristor memory cell is programmed to a voltage such that the thyristor memory cell is undisturbed by reading another thyristor memory cell coupled to the data line. The thyristor memory cell can be operated with the second end of the thyristor memory cell at zero volts. Applying the access pulse and the data pulse structured such that, after writing to the thyristor memory cell, the base of the thyristor memory cell is programmed to a voltage can comprise applying an access pulse structured such that the base is programmed to a voltage below a level where the thyristor memory cell latches without assist of a pulse applied to the gate of the thyristor memory cell. The selected value can be a voltage less than a voltage to latch the thyristor memory cell in the absence of an access pulse.

In various embodiments, a method of writing data to a thyristor memory cell can comprise applying a data pulse to a data line coupled to the thyristor memory cell such that a voltage on the data line moves to a data pulse height and then the voltage on the data line moves from the data pulse height to a data line standby level; and applying an access pulse to an access line coupled to a gate of the thyristor memory cell such that a voltage on the access line moves to an access pulse height and then the voltage on the access line moves from the access pulse height to an access standby level such that the voltage on the access line comes to the access standby level after the voltage on the data line comes to the data line standby level. Applying the access pulse can include applying an access pulse structured such that a trailing edge of the access pulse begins before a trailing edge of the data pulse begins and applying the data pulse includes applying a data pulse structured such that the voltage on the data line comes to the data line standby level before the voltage on the access line is within a selected voltage range from the access standby level. Applying the access pulse can include applying an access pulse structured such that the voltage on the access line is approximately equal to a voltage on the access line used to conduct a data read operation of the thyristor memory cell when the voltage on the data line comes to the data line standby level. The access standby level can have a voltage less than zero volts. Applying the access pulse in the method can include applying an access pulse structured such that, while the voltage on the access line is moving from the access pulse height to the access standby level, the voltage of the access line moves to and is maintained at an intermediate level until at least the voltage on the data line comes to the data line standby level. Applying the data and access pulses programs a base of the thyristor memory cell to a voltage based on the intermediate level. The intermediate level can be set to equal approximately a voltage on the access line used during a read of the thyristor memory cell. The method can be conducted such that applying the data pulse to the data line coupled to the thyristor memory cell can include applying a data pulse to a data line coupled to a thyristor memory cell in an array with other thyristor memory cells such that the second end of each thyristor memory cell in the array are coupled to a common node. The method can include fixing the common node to zero volts during operation of the thyristor memory cell. For a pnpn thyristor memory cell, the second end can be configured as a cathode. Alternatively, with the structure of the each thyristor memory cell reversed with respect to semiconductor conductivity type, the anodes of each thyristor memory cell in the array can be coupled to a common anode. The common anode for the anodes can be fixed to zero volts during operation of the thyristor memory cell.

In various embodiments, a method of writing data to a thyristor memory cell can comprise applying a data pulse to a data line coupled to the thyristor memory cell such that a voltage on the data line moves to a data pulse height, then the voltage on the data line moves from the data pulse height to a data line intermediate level and is maintained at the data line intermediate level, and then the voltage on the data line moves from the data line intermediate level to a data line standby level; and applying an access pulse to an access line coupled to a gate of the thyristor memory cell such that a voltage on the access line moves to an access pulse height, then the voltage on the access line moves from the access pulse height to an access intermediate level and is maintained at the access intermediate level, and then the voltage on the access line is moved from the access intermediate level to an access standby level line, wherein the voltage on the access line comes to the access intermediate level before the voltage on the data line comes to the data line intermediate level. Applying the access pulse can further include applying an access pulse structured such that the voltage on the access line comes to the access intermediate level before the voltage on the data line begins moving from the data pulse height to the data line intermediate level. Applying the access pulse can further include applying an access pulse structured such that the voltage on the access line comes to the access standby level before the voltage on the data line begins moving from the data line intermediate level to the data line standby level. Applying the access pulse further can further include applying an access pulse structured such that the voltage on the access line comes to the access standby level before the voltage on the comes to the data line standby level.

In various embodiments, a method of writing data to a thyristor memory cell can comprise applying a data pulse to a data line coupled to the thyristor memory cell, such that a voltage on the data line moves to a data pulse height, then the voltage on the data line moves from the data pulse height to a data line standby level; applying a first access pulse to an access line coupled to a gate of the thyristor memory cell, such that a voltage on the access line moves to an access pulse height, then the voltage on the access line moves from the access pulse height to a level below the access pulse height; and applying a second access pulse to the access line such that a voltage on the access line moves from the level below the access pulse height of the first access pulse to an access pulse height of the second access pulse. The access pulse height of the first access pulse can be higher than the access pulse height of the second access pulse. The second access pulse can have a pulse time less than a pulse time of the data pulse. The access pulse height of the second access pulse can be approximately equal to a voltage on the access line used during a data read operation. The level below the access pulse height can be an access standby level. Applying the first access pulse can comprise applying a first access pulse structured such that the voltage on the access line comes to the access standby level before the voltage on the data line begins moving from the data pulse height to the data line standby level. Applying the first access pulse can comprise applying a first access pulse structured such that the voltage on the access line comes to the access standby level before the voltage on the data line begins moving from the data pulse height to the data line standby level, wherein applying the data pulse can comprise applying a data pulse further structured such that the voltage on the data line comes to the data line standby level after the voltage on the access line comes to the access standby level and before the voltage on the access line begins moving from the access standby level to the access pulse height of the second access pulse. Applying the data pulse can comprise applying a data pulse further structured such that the voltage on the data line comes to the data line standby level after the voltage on the access line comes to the access standby level and before the voltage on the access line begins moving from the access standby level to the access pulse height of the second access pulse, wherein applying the data pulse can comprise applying a data pulse further structured such that the voltage on the data line comes to the data line standby level while the voltage on the access line is at the access standby level. In an embodiment, applying the data pulse can further comprise applying a data pulse further structured such that, after the voltage on the data line begins moving to the data line standby level, the voltage on the data line is maintained at a data line intermediate level before it continues moving to the data line standby level. Applying the data pulse can comprise applying a data pulse further structured such that, after the voltage on the data line begins moving to the data line standby level, the voltage on the data line is maintained at a data line intermediate level before it continues moving to the data line standby level, wherein applying the data pulse can comprise applying a data pulse further structured such that the voltage on the data line is maintained at the data line intermediate level after the voltage on the access line comes to the access standby relative to the first access pulse and before the voltage on the access line begins moving from the access standby level to the access pulse height of the second access pulse level.

In various embodiments, a method of writing data to a thyristor memory cell can include applying a data pulse to a data line coupled to the thyristor memory cell such that a voltage on the data line moves to a data pulse height and then the voltage on the data line moves from the data pulse height to a data line standby level; and applying an access pulse to an access line coupled to a gate of the thyristor memory cell such that a voltage on the access line moves to an access pulse height and then the voltage on the access line moves from the access pulse height to an access standby level such that the voltage on the access line comes to the access standby level as the voltage on the data line comes to the data line standby level. Applying the access pulse can include applying an access pulse structured such that a trailing edge of the access pulse begins before a trailing edge of the data pulse begins. Applying the access pulse can include applying an access pulse structured such that, while the voltage on the access line is moving from the access pulse height to the access standby level, the voltage of the access line moves to an intermediate level before the voltage on the data line begins to move from the data pulse height to a data line standby level and the voltage of the access line is maintained at the intermediate level for a selected amount of time and then moving to the access standby level. Applying the data and access pulses can program a base of the thyristor memory cell to a voltage based on the intermediate level.

In various embodiments, an apparatus can comprise a thyristor memory cell having a first end, a gate, and a second end, the first end coupled to a data line, the gate coupled to an access line, and the second end coupled to a reference node; and control circuitry coupled to the data line and coupled to the access line, the control circuitry configured to apply a data pulse to the data line and an access pulse to the access line, the access pulse and the data pulse structured such that, after writing to the thyristor memory cells, a base of the thyristor memory cell is programmed to a voltage such that the thyristor memory cell is undisturbed by reading another thyristor memory cell coupled to the data line. The first end can be a region of p-type material, the second end can be a region of n-type material, the base can be a region of p-type material, and the base can be separated from the first region by a region of n-type material. Alternatively, the first end can be a region of n-type material, the second end can be a region of p-type material, the base can be a region of n-type material, and the base can be separated from the cathode by a region of p-type material. The first end can be configured as an anode with the second end configured as a cathode, with the anode coupled to the data line. Alternatively, the first end can be configured as a cathode with the second end configured as an anode, with the cathode coupled to the data line. The second end of each thyristor memory cell in the array can be coupled to a common node. The thyristor memory cell can be a silicon-based thyristor memory cell. The thyristor memory cell can include an additional gate separated from a semiconductor region of the thyristor memory cell by a dielectric. The additional gate can be coupled to an additional access line. The control circuitry can be configured to apply a DC signal on the additional access line.

Figure 12:
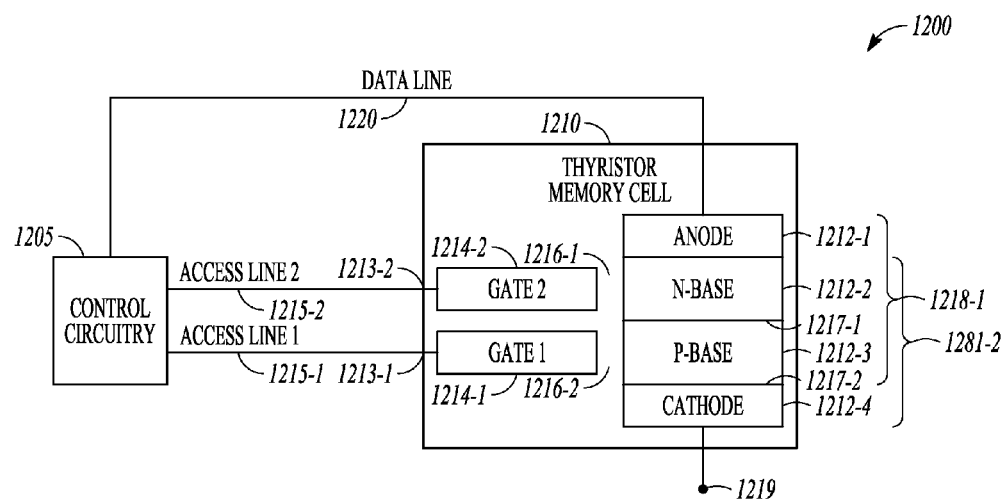
FIG. 12 shows a block diagram of an embodiment of an apparatus including a dual gate thyristor memory cell with an operatively fixed cathode, in accordance with various embodiments.

FIG. 12 shows a block diagram of an embodiment of an apparatus 1200 including a dual gate thyristor memory cell 1210 with an operatively fixed cathode. Apparatus 1200 includes control circuitry 1205 to apply signals to control nodes 1211, 1213-1, and 1213-2. Control circuitry 1205 can apply a signal to control node 1211 via a data line 1220. Data line 1220 may be arranged to also receive a signal from control node 1211. Control node 1213-1 can couple control circuitry 1205 to a gate 1214-1 of TRAM cell 1210 via access line 1215-1. Control node 1213-2 can couple control circuitry 1205 to a gate 1214-2 of thyristor memory cell 1210 via access line 1215-2. Control circuitry 1205 can apply signals to control nodes 1211, 1213-1, and 1213-2 as pulses. The pulses can be sequenced to write to TRAM 1210 in a manner similar to the write schemes associated with FIGS. 6-11. Access pulses to gates 1214-1 and 1214-1 can be structured such that, in writing a data state into TRAM 1210, the voltage can be adjusted by the access pulses such that TRAM 1210, after the write operation, remains unselected in a standby state when another TRAM 1210 coupled to access line 1218 is read. TRAM 1210 can be structured as a dual gate TRAM having a cathode coupled to a node that is operatively fixed to a voltage and is not coupled to a control node such that no signal is directed to the cathode in operating the dual gate TRAM 1210.

TRAM cell 1210 includes four semiconductor regions 1212-1, 1212-2, 1212-3, and 1212-4, where each region is of a different conductivity type from the adjoining region that it contacts. Region 1212-1 can be structured as an anode coupled to control node 1211. Region 1212-4 can be structured as a cathode. Region 1212-3 is structured as a base separated from gate 1214-1 by a dielectric 1216-1. Region 1212-2 is separated from gate 1214-2 by a dielectric 1216-2. Gate 1214-1 can be coupled to control node 1213-1. Gate 1214-2 can be coupled to control node 1213-2. Region 1212-4 structured as a cathode can be fixed to a node 1219 that is not structured in apparatus 1200 to receive a control signal. Node 1219 can be structured as a reference voltage node common to all TRAM cells in a memory array. Node 1219 can be arranged to couple to ground or to a fixed reference voltage such as zero volts. The fixed reference voltage may be set to a fixed non-zero voltage. Polarity of the voltage at node 1219 can be set such that, in operation, TRAM 110 has a higher voltage at the anode than at the cathode.

In an example embodiment, TRAM cell 1210 can be structured with region 1212-1 formed as a p+-type semiconductor region, region 1212-2 formed as a n-type semiconductor region, region 1212-3 formed as a p-type semiconductor region, and region 1212-4 formed as a n+-type semiconductor region. P+-type semiconductor region 1212-1, n-type semiconductor region 1212-2, and p-type semiconductor region 1212-3 form a pnp bipolar transistor 1218-1 having n-type semiconductor region112-2 as a base, which can be referred to as a nbase. N-type semiconductor region 1212-2, p-type semiconductor region 1212-3, and n+-type semiconductor region 1212-4 form a npn bipolar transistor 1218-2 having p-type semiconductor region112-3 as a base, which can be referred to as a pbase. Gate 1214-1 is capacitively coupled to pbase 1212-3 by dielectric 1216-1. Gate 1214-2 is capacitively coupled to n-type semiconductor region (nbase) 1212-2 by dielectric 1216-1. Junctions 1217-1 and 1217-2 to pbase 1212-3 may provide charge leakages such that periodic restore or refresh may be conducted to maintain the data state.

Alternatively, TRAM cell 1210 can be structured with region 1212-1 formed as a n+-type semiconductor region, region 1212-2 formed as a p-type semiconductor region, region 1212-3 formed as a n-type semiconductor region, and region 1212-4 formed as a p+-type semiconductor region. In such a configuration, region 1212-1 is a cathode and region 1212-4 is an anode. In this case, n+-type semiconductor region 1212-1, p-type semiconductor region 1212-2, and n-type semiconductor region 1212-3 form bipolar transistor 1218-1 as a npn transistor 1218-1. Also in this case, p-type semiconductor region 1212-2, n-type semiconductor region 1212-3, and p+-type semiconductor region 1212-4 form bipolar transistor 1218-2 as a pnp transistor 1218-2 having n-type semiconductor region 1212-3 as a base, which can be referred to as a n-base. Gate 1216-1 is capacitively coupled to nbase 1212-3 by dielectric 1216-1. Gate 1214-2 is capacitively coupled to p-type semiconductor region 1212-2 by dielectric 1216-2. Junctions 1217-1 and 1217-2 to nbase 112-3 may provide charge leakages such that periodic refresh may be conducted to maintain the data state.

Access pulses applied to access lines 1215-1 and 1215-2 can be structured in a number of different formats. With an access pulse applied to an access line 1215-1 coupled to gate 1214-1 arranged as discussed herein to write a high state and then adjust the voltage of base 1212-3 to a lower voltage such that TRAM 1210 does not latch when no select signal is applied to gate 1214-1, an access pulse applied to an access line 1215-2 coupled to gate 1214-2 can be provided as a DC level to aid the access pulse applied to the access line 1215-1. Sequencing of access pulses at gates 1214-1 and 1214-2 can be arranged to place base 1212-3 at a selected reduced voltage after raising the voltage of base 1212-3 to write to TRAM 1210. The selected voltage can be set to a level without significantly degrading the retention time of TRAM 1210.

Figure 13:
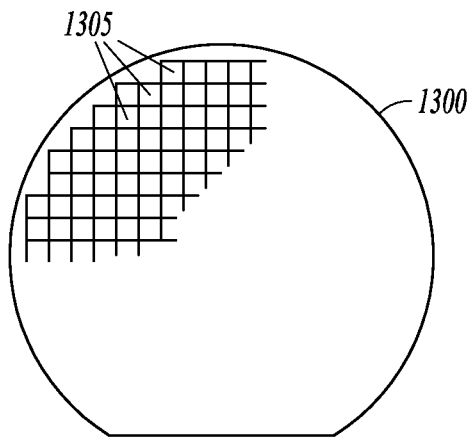
FIG. 13 shows an example wafer, in accordance with various embodiments.

FIG. 13 illustrates an example wafer 1300, in accordance with various embodiments. Wafer 1300 can be provided as a semiconductor wafer or a semiconductor on insulator wafer in which a plurality of dice 1305 can be fabricated to include circuitry to apply write schemes for a thyristor memory cell in which an access pulse is applied to the gate of the thyristor memory cell is adjusted relative to the data pulse to write data into the thyristor memory cell. The write schemes may include write schemes to substantially reduce or eliminate an unselected data line disturb. The TRAM cell can be structured with two control nodes and its cathode coupled to a reference voltage node common to all thyristor memory cells in a memory array. The TRAM cell can be structured as a dual gate thyristor memory cell with an operatively fixed cathode. Alternatively, wafer 1300 can be provided as a wafer in which the plurality of dice 305 are structured that have been processed to provide electronic functionality including write schemes for a thyristor memory cell, with two control nodes and its cathode coupled to a reference voltage node common to all thyristor memory cells in a memory array, in which an access pulse applied to the gate of the thyristor memory cell is adjusted relative to the data pulse to write data into the thyristor memory cell and are awaiting singulation from wafer 1300 and packaging. The TRAM cells can be formed in dice 1305 with structures having architectures similar to or identical to FIG. 1 or FIG. 12 and architectures to operate in a manner similar to operating as discussed with respect to any of FIGS. 6-11. Alternatively, the TRAM cells can be formed with opposite conductivity types and configured to operate with appropriate voltages. Wafer 1300 can be fabricated in accordance with conventional procedures. Using various masking and processing techniques, various sets of dice 1305 can be processed to include functional circuitry such that not all of dice 1305 are fabricated as an integrated circuit chip with the same functionality and packaged structure as other dice on wafer 1300. A packaged die having circuits integrated thereon providing electronic capabilities is herein referred to as an integrated circuit (IC).

Figure 14:
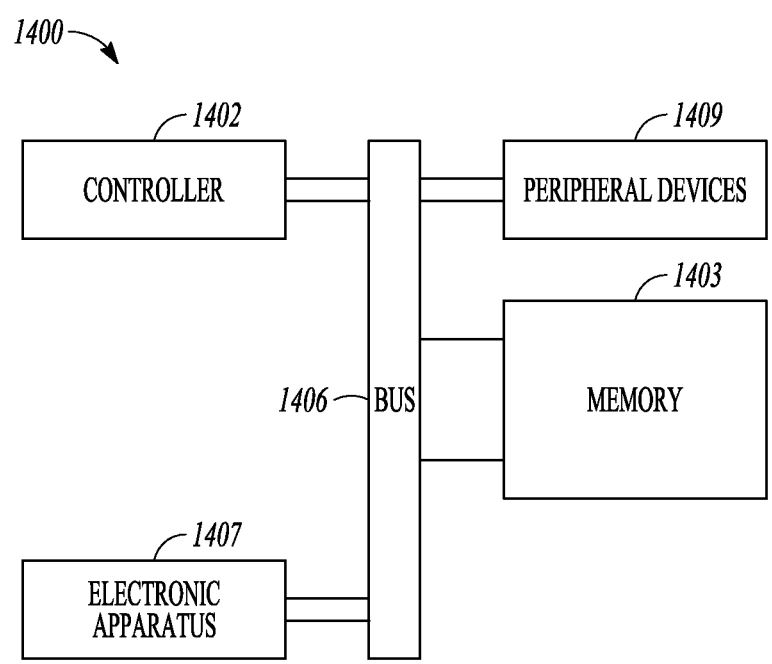
FIG. 14 shows a block diagram of various features of an example electronic system, in accordance with various embodiments.

FIG. 14 shows a block diagram of an embodiment of an apparatus in the form of an example system 1400 that includes a memory 1403 structured with a memory array of thyristor memory cell. Each of the TRAM cells can be arranged with an anode of the TRAM cell coupled to a data line, with a gate of the TRAM cell coupled to an access line, and with a cathode coupled to a common node such that the common node is coupled to the cathodes of TRAM cells of the memory array. Alternatively, each of the TRAM cell can be structured as a dual gate thyristor memory cell with an operatively fixed cathode. Memory 1403 can be structured to apply data pulses and access pulses to write data into selected TRAM cells such that the data pulses and access pulses are structured according to any of the write schemes as discussed herein, for example, with respect to FIGS. 6-11. Alternatively, the TRAM cells can be formed with opposite conductivity types and configured to operate with appropriate voltages. System 1400 can include a controller 1402 operatively coupled to memory 1403. Controller 1402 can be configured to apply signals to memory 1403 to provide the data pulses and access pulses. System 1400 can also include an electronic apparatus 1407 and peripheral devices 1409. Electronic apparatus 1407 may include a memory controller that applies data pulses and access pulses to write to memory 1403 according to any of the write schemes as discussed herein. One or more of controller 1402, memory 1403, electronic apparatus 1407, and peripheral devices 1409 can be in the form of one or more ICs. A bus 1406 provides electrical conductivity between and/or among various components of system 1400. In an embodiment, bus 1406 includes an address bus, a data bus, and a control bus, each independently configured. In an alternative embodiment, bus 1406 uses common conductive lines for providing one or more of address, data, or control, the use of which is regulated by controller 1402. Controller 1402 can be in the form or one or more processors.

Electronic apparatus 1407 may include additional memory. In addition to TRAM devices, memory in system 1400 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1409 may include displays, imaging devices, printing devices, wireless devices, additional storage memory, and control devices that may operate in conjunction with controller 1402. In various embodiments, system 1400 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Thus, the following claims are hereby incorporated into the Detailed Description, with each claim standing on its own as a separate embodiment.

What is claimed is:

1. A method of writing data to a thyristor memory cell, comprising:
    applying a data pulse to a data line coupled to a first end of the thyristor memory cell, the thyristor memory cell having a second end coupled to a fixed voltage; and
    applying an access pulse to an access line coupled to a gate of the thyristor memory cell, the access pulse and the data pulse structured such that, after writing to the thyristor memory cell, a base of the thyristor memory cell is programmed to a voltage such that the thyristor memory cell is undisturbed by reading another thyristor memory cell coupled to the data line, wherein the access pulse is further structured such that the base is programmed to a voltage below a level where the thyristor memory cell latches without assist of a pulse applied to the gate of the thyristor memory cell.

2. The method of claim 1, wherein the method includes operating the thyristor memory cell with the second end at zero volts.

3. An apparatus comprising:
    a thyristor memory cell having a first end, a gate, and a second end, the first end coupled to a data line, the gate coupled to an access line, the second end coupled to a reference node; and
    control circuitry coupled to the data line and coupled to the access line, the control circuitry configured to apply a data pulse to the data line and an access pulse to the access line, the access pulse and the data pulse structured such that, after writing to the thyristor memory cells, a base of the thyristor memory cell is programmed to a voltage such that the thyristor memory cell is undisturbed by reading another thyristor memory cell coupled to the data line, wherein the access pulse is further structured such that the base is programmed to a voltage below a level where the thyristor memory cell latches without assist of a pulse applied to the gate of the thyristor memory cell.

4. The apparatus of claim 3, wherein the first end is a region of p-type material, the second end is a region of n-type material, the base is a region of p-type material, and the base is separated from the first end by a region of n-type material.

5. The apparatus of claim 3, wherein the first end is a region of n-type material, the second end is a region of p-type material, the base is a region of n-type material, and the base is separated from the first end by a region of p-type material.

6. The apparatus of claim 3, wherein the second end of each thyristor memory cell in the array is coupled to a common node.

7. The apparatus of claim 3, wherein the thyristor memory cell is a silicon-based thyristor memory cell.

8. The apparatus of claim 3, wherein the thyristor memory cell includes an additional gate separated from a semiconductor region of the thyristor memory cell by a dielectric.

9. The apparatus of claim 8, wherein the additional gate is coupled to an additional access line.

10. The apparatus of claim 9, wherein the control circuitry is configured to apply a DC signal on the additional access line.

11. The method of claim 1, further comprising coupling the second end to a fixed non-zero voltage.

12. The method of claim 1, further comprising coupling the second end to a node common to all thyristor memory cells in a memory array.

13. The method of claim 1, further comprising coupling the second end to a node having a higher voltage at an anode than at a cathode of the thyristor memory cell.

* * * * *